United States Patent
Yukizaki et al.

(10) Patent No.: US 9,590,294 B2
(45) Date of Patent: *Mar. 7, 2017

(54) VEHICLE-MOUNTED ANTENNA DEVICE

(71) Applicant: DENSO CORPORATION, Kariya, Aichi-pref. (JP)

(72) Inventors: Yasumune Yukizaki, Okazaki (JP); Tadao Suzuki, Kariya (JP); Ryohei Kataoka, Okazaki (JP); Yuji Sugimoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/425,277

(22) PCT Filed: Jun. 20, 2013

(86) PCT No.: PCT/JP2013/003858
§ 371 (c)(1),
(2) Date: Mar. 2, 2015

(87) PCT Pub. No.: WO2014/033994
PCT Pub. Date: Mar. 6, 2014

(65) Prior Publication Data
US 2015/0229021 A1     Aug. 13, 2015

(30) Foreign Application Priority Data

Sep. 3, 2012   (JP) ................................ 2012-193250

(51) Int. Cl.
*H01Q 1/32* (2006.01)
*H01Q 1/24* (2006.01)
(Continued)

(52) U.S. Cl.
CPC ............. *H01Q 1/3275* (2013.01); *H01Q 1/02* (2013.01); *H01Q 1/241* (2013.01); *H01Q 1/42* (2013.01);
(Continued)

(58) Field of Classification Search
CPC .................................................... H01Q 1/3275
See application file for complete search history.

(56) References Cited

U.S. PATENT DOCUMENTS

2003/0137463 A1   7/2003  Shimizu
2005/0062658 A1   3/2005  Magg et al.
(Continued)

FOREIGN PATENT DOCUMENTS

JP     2009514253 A    4/2009
JP     2009135741 A    6/2009
(Continued)

OTHER PUBLICATIONS

Extended European Search Report dated Mar. 17, 2016 issued in the corresponding EP application No. 13833774.6.
(Continued)

*Primary Examiner* — Hoang V Nguyen
*Assistant Examiner* — Michael Bouizza
(74) *Attorney, Agent, or Firm* — Harness, Dickey & Pierce, P.L.C.

(57) ABSTRACT

A vehicle-mounted antenna device includes a base, a board, a circuit section, and a housing. The base is mountable on a roof of a vehicle. The board has an antenna element section and is stood on a surface of the base. The circuit section serves as at least part of a wireless communication circuit electrically connected to the antenna element section. The housing is made of a resin material and forms a projection of a vehicle outer shape. The board and the circuit section are located in space formed by the base and the housing. The (Continued)

board is stood on the surface of the base so that a first direction perpendicular to the surface of the base differs from a second direction equal to a thickness direction of the board. The circuit section implemented on the board at a position away from the base in the first direction.

16 Claims, 3 Drawing Sheets

(51) Int. Cl.
  *H01Q 1/42* (2006.01)
  *H05K 1/18* (2006.01)
  *H05K 5/00* (2006.01)
  *H01Q 9/42* (2006.01)
  *H01Q 1/02* (2006.01)
(52) U.S. Cl.
  CPC .............. *H01Q 9/42* (2013.01); *H05K 1/181* (2013.01); *H05K 5/003* (2013.01); *H05K 2201/10098* (2013.01); *H05K 2201/10507* (2013.01)

(56) References Cited

U.S. PATENT DOCUMENTS

| | | |
|---|---|---|
| 2005/0219131 A1 | 10/2005 | Haidacher et al. |
| 2010/0013724 A1 | 1/2010 | Ohshima et al. |
| 2010/0265147 A1 | 10/2010 | Wakui et al. |
| 2012/0081256 A1 | 4/2012 | Aizawa et al. |

FOREIGN PATENT DOCUMENTS

| | | |
|---|---|---|
| JP | 2010021856 A | 1/2010 |
| JP | 2012080388 A | 4/2012 |
| JP | 2012161075 A | 8/2012 |

OTHER PUBLICATIONS

International Search Report and Written Opinion (in Japanese with English Translation) for PCT/JP2013/003858, mailed Sep. 3, 2013; ISA/JP.

FIRST DIRECTION

SECOND DIRECTION

VEHICLE-MOUNTED ANTENNA DEVICE

CROSS REFERENCE TO RELATED APPLICATIONS

This application is a U.S. National Phase Application under 35 U.S.C. 371 of International Application No. PCT/JP2013/003858 filed on Jun. 20, 2013 and published in Japanese as WO 2014/033994 A1 on Mar. 6, 2014. This application is based on and claims the benefit of priority from Japanese Patent Application No. 2012-193250 filed on Sep. 3, 2012. The entire disclosures of all of the above applications are incorporated herein by reference.

TECHNICAL FIELD

The present disclosure relates to vehicle-mounted antenna devices and in particular, relates to a vehicle-mounted antenna device used for vehicle-to-vehicle communication and vehicle-to-road-side communication.

BACKGROUND ART

As disclosed in a patent literature 1, an antenna device is known that has a GPS antenna, a DTV antenna, and a radio antenna which are placed in space formed by an antenna base (hereinafter referred to as a base) and an antenna cover (hereinafter referred to as a housing) as a projection of a vehicle outer shape.

PRIOR ART LITERATURES

Patent Literature

Patent Literature 1: JP 2012-80388A

SUMMARY OF INVENTION

In antenna devices, as frequencies of radio waves to be used become higher, loss in a transmission cable, i.e., transmission loss becomes more significant. In particular, an antenna device used for vehicle-to-vehicle communication and vehicle-to-road-side communication uses radio waves of a high frequency of 5.9 GHz band to be used become higher, and therefore the transmission loss becomes significant. In this case, both the board having the antenna element section and at least part of a wireless communication circuit capable of performing wireless communication with an external device may be placed in the space formed by the housing and the base. When the antenna element section and the circuit section are placed in the same space, the circuit section is located close to the antenna element section, so that the transmission loss can be reduced.

However, when the antenna device is mounted on a roof of a vehicle, heat radiated from the sun is transferred to the base through the roof. The heat of the base is transferred to the circuit section, which is placed in the space between the housing and the base, and also dissipated in the space. Since the heat stays in the space, a temperature of the circuit section increases, and performance of the circuit section may be degraded. However, forming a vent or adding a cooling fan is undesirable from a design perspective because the housing is sealed and part of the outer shape of the vehicle.

In view of the above, it is an object of the present disclosure to reduce degradation in performance of a circuit section without loss of design of a housing in a vehicle-mounted antenna device which uses radio waves of a high frequency.

According to a first aspect of the present disclosure, a vehicle-mounted antenna device includes a base, a board, a circuit section, and a housing. The base is mountable on a roof of a vehicle. The board has an antenna element section and is stood on a surface of the base. The circuit section serves as at least part of a wireless communication circuit electrically connected to the antenna element section. The housing is made of a resin material and forms a projection of a vehicle outer shape. The board and the circuit section are located in space formed by the base and the housing. The board is stood on the surface of the base so that a first direction perpendicular to the surface of the base differs from a second direction equal to a thickness direction of the board. The circuit section is implemented on the board at a position away from the base in the first direction.

Since the board and the circuit section are located in the space formed by the base and the housing, and the circuit section is implemented on the board, the circuit section is located close to the antenna element section. Thus, transmission loss can be reduced even when radio waves of a high frequency are used. Therefore, for example, the vehicle-mounted antenna device can be suitable for applications where radio waves of a frequency of a few GHz band are used.

Further, the board is stood on the base, and the circuit section is implemented on the board at a position away from the base. In such an approach, heat radiated from the sun and transferred from the roof to the circuit section through the base can be reduced compared to when the circuit section is in contact with the base. Thus, an increase in temperature of the circuit section can be reduced. Therefore, degradation in performance of the circuit section caused by a temperature increase can be reduced without loss of design of the housing.

According to a second aspect of the present disclosure, the first direction and the second direction are perpendicular to each other, and an opening width of the housing in the second direction decreases with an increase in distance from the base in the first direction.

When the circuit section is implemented away from the base, a distance between the circuit section and the housing is small compared to when the circuit section is implemented in contact with the base. Thus, since heat generated by the circuit section itself and heat radiated from the sun and transferred to the circuit section are likely to be dissipated to the housing, the degradation in performance of the circuit section can be reduced more effectively. It is noted that the housing forms the projection of the vehicle outer shape. Therefore, the housing is cooled by airflow generated when the vehicle is moving.

According to a third aspect of the present disclosure, an area of an opening surface of the housing perpendicular to the first direction decreases with the increase in distance from the base in the first direction.

The opening surface area of a portion where the circuit section is located is smaller than the opening surface area of a portion located closer to the base than the circuit section in the first direction. Thus, in a plane perpendicular to not only the second direction but also the first direction, both heat from the circuit section and heat from the board on which the circuit section is implemented are likely to be dissipated to the housing. Therefore, the degradation in performance of the circuit section can be reduced more effectively.

According to a fourth aspect of the present disclosure, the first direction and the second direction are perpendicular to each other, and the housing has a lower part and an upper part. The lower part extends from an end of the housing on the base side to a predetermined height in the first direction. The upper part is located further away from the base than the lower part. A minimum value of an opening width of the lower part in the second direction is greater than a maximum value of an opening width of the upper part in the second direction. The circuit section is located in the upper part.

When the circuit section is located in the upper part, a distance between the circuit section and the housing is small compared to when the circuit section is located in the lower part. Thus, since heat generated by the circuit section itself and heat radiated from the sun and transferred to the circuit section are likely to be dissipated to the housing, the degradation in performance of the circuit section can be reduced more effectively.

BRIEF DESCRIPTION OF THE DRAWINGS

The above and other objects, features and advantages of the present disclosure will become more apparent from the following detailed description made with reference to the accompanying drawings. In the drawings.

EMBODIMENTS FOR CARRYING OUT INVENTION

Below, embodiments of the present disclosure are described with reference to the drawings. Throughout the embodiments, like characters of reference indicate the same or equivalent parts.

First Embodiment

Figure 1:
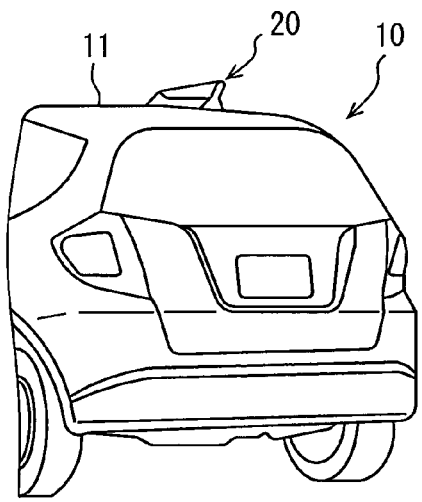
FIG. 1 is a diagram illustrating a position where a vehicle-mounted antenna device according to a first embodiment is mounted.

As shown in FIG. 1, a vehicle-mounted antenna device 20 according to the present embodiment is mounted on a roof 11 of a vehicle 10. The vehicle-mounted antenna device 20 is what is called a shark fin antenna device. The vehicle-mounted antenna device 20 is hereinafter simply referred to as the antenna device 20.

Figure 2:
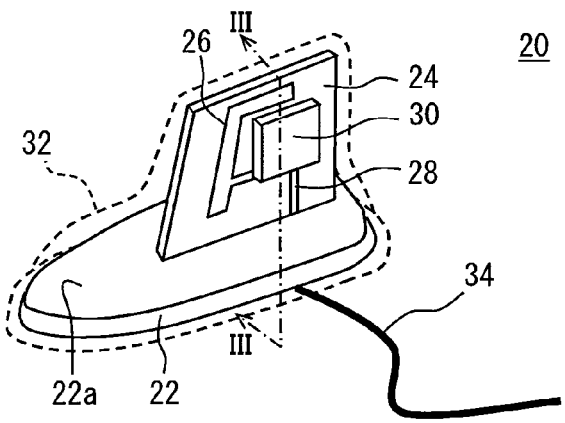
FIG. 2 is a diagram illustrating a perspective view of a simplified structure of the vehicle-mounted antenna device according to the first embodiment, in which a housing is indicated by a broken line to show an inner structure.
Figure 3:
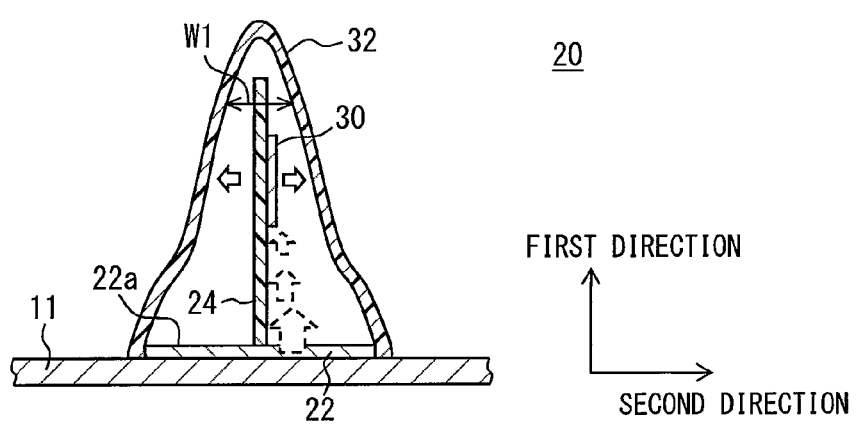
FIG. 3 is a diagram illustrating a cross-sectional view taken along the line III-III in FIG. 2, in which a broken arrow indicates transfer of heat radiated from the sun, and a solid arrow indicates dissipation of heat from a circuit section and a board to the housing.

As shown in FIGS. 2 and 3, the antenna device 20 mainly includes a base 22, a board 24 having an antenna element section 26, a circuit section 30 serving as at least part of a wireless communication circuit, and a housing 32 made of a resin material and forming a projection of a vehicle outer shape.

The base 22 is used to fix the board 24 to the vehicle 10 and mounted on the roof 11 through a mounting member which is not shown. The base 22 has a flat plate shape and is mounted almost parallel to the roof 11. Further, when the base 22 is made of a metal material and electrically connected to the roof 11 through the mounting member, the base 22 serves as a ground plane. Whether or not it is used as a ground plane can be determined by the intended used of the antenna device 20.

The board 24 has the antenna element section 26. According to the present embodiment, the antenna element section 26 has an antenna element designed for vehicle-to-vehicle communication which uses radio waves of a frequency of 5.9 GHz band. The board 24 is what is called a printed wiring board, and the antenna element section 26 is formed as part of wiring patterns of the printed wiring board. The board 24 has a base member made of an electrically insulating material such as resin, and the antenna element section 26 is formed as a wiring pattern on a surface of at least one side of the base member. According to the first embodiment, the antenna element section 26 is formed by patterning copper foil on one surface of the base member.

The board 24 is stood on a first surface 22a of the base 22. A direction perpendicular to the first surface 22a of the base 22, i.e., a thickness direction of the base 22 is hereinafter referred to as the first direction. Further, a thickness direction of the board 24, i.e., a direction perpendicular to a surface of the board 24 where the antenna element section 26 is formed is hereinafter referred to as the second direction. The meaning of "stood" is that the board 24 is fixed to the base 22 so that the second direction can be different from the first direction. That is, it does not include a case where the board 24 is stacked on the first surface 22a of the base 22 so that the thickness direction of the board 24 can be almost equal to the thickness direction of the base 22. According to the present embodiment, the board 24 is fixed to the base 22 by a fixing member, which is not shown, so that the surface of the board 24 where the antenna element section 26 is formed can be almost orthogonal to the first surface 22a of the base 22. In other words, as shown in FIG. 3, the board 24 is fixed to the base 22 so that the first direction as the thickness direction of the base 22 can be almost orthogonal to the second direction as the thickness direction of the board 24. It is noted that a character 28 in FIG. 2 represents a connection line which is formed as part of the wiring patterns and electrically connects the circuit section 30 to a data communication cable 34, which is described later.

The circuit section 30 is electrically connected to the antenna element section 26 and serves as at least part of the wireless communication circuit which performs wireless communication with an external device through the antenna element section 26. The circuit section 30 is implemented on the board 24 at a position away from the first surface 22a of the base 22 in the first direction. That is, the circuit section 30 is implemented on the board 24 at a position where the circuit section 30 is not in contact with the base 22.

For example, the circuit section 30 includes a power amplifier for amplifying a transmitting signal. In addition to the power amplifier, the circuit section 30 can include a low-noise amplifier for amplifying a receiving signal. Further, in addition to the power amplifier and the low-noise amplifier, it can include a switch for switching a power supply line between a transmitting side and a receiving side. Further, in addition to the power amplifier, the low-noise amplifier, and the switch, it can include a transmitting-side bandpass filter and a receiving-side bandpass filter. In this way, it can include components of a RF circuit (a radio frequency transceiver circuit). Further, it can include a baseband circuit.

The circuit section 30 can be a circuit board having a printed wiring board on which an electronic component is implemented, a package in which an electronic component such as a semiconductor chip is packaged, or a semiconductor chip in which a circuit is integrated. According to the present embodiment, the circuit section 30 is a mold package as a wireless communication module in which the whole of the wireless communication circuit is integrally sealed with resin.

The housing 32 is made of a resin material and forms the projection of the vehicle outer shape. A sealed space where the board 24 and the circuit section 30 are placed is formed between the housing 32 and the base 22. The housing 32 is shaped like a shark fin so that it can form a projection of the roof 11.

As shown in FIG. 3, according to the present embodiment, the housing 32 is structured so that, an opening width W1 of the space, where the board 24 is located, in the second direction can decrease in a direction perpendicular to each of the first direction and the second direction with an increase in a distance from the base 22 in the first direction. In other words, a distance between the board 24 and the housing 32 in the second direction decreases with an increase in a distance from the first surface 22a of the base 22 in the first direction. Further, according to the present embodiment, not only the opening width W1 in the second direction but also the area of an opening of the housing 32 in a direction perpendicular to the first direction decreases with an increase in a distance from the base 22 in the first direction. It is noted that the opening width represents a width of a hollow of the housing 32.

In the antenna device 20 configured in the above manner, transmitting data is transmitted from the external device to the circuit section 30 through a cable 34. Then, the circuit section 30 performs format conversion for wireless communication, modulation, up-conversion (frequency conversion), and power amplification and transmits radio waves from the antenna element section 26. On the other hand, radio waves received through the antenna element section 26 are inputted to the circuit section 30. Then, the circuit section 30 generates receiving data by performing power amplification, down-conversion (frequency conversion), demodulation, and format conversion for wired communication and transmits it to the external device through the cable 34.

Next, an effect of the antenna device 20 is described.

According to the present embodiment, as shown in FIGS. 2 and 3, not only the board 24 having the antenna element section 26 but also the circuit section 30 is placed in the space formed by the base 22 and the housing 32. Further, the circuit section 30 is implemented on the board 24. In such an approach, the circuit section 30 is located closer to the antenna element section 26. Thus, even when radio waves of a high frequency are used, transmission loss can be reduced.

Therefore, for example, the antenna device 20 can be suitable for applications where radio waves of a frequency of a few GHz band are used, such as vehicle-to-vehicle communication and vehicle-to-road-side communication.

Further, the board 24 is stood on the base 22, and the circuit section 30 is implemented on the board 24 at a position away from the base 22 in the first direction. In such an approach, the circuit section 30 can be located away from the base 22 compared to when the circuit section 30 is in contact with the base 22 or compared to when the board 24 is stacked on the base 22. Thus, as indicated by a broken line in FIG. 3, heat radiated from the sun and transferred from the roof 11 to the circuit section 30 through the base 22 can be reduced. That is, an increase in temperature of the circuit section 30 can be reduced. Therefore, degradation in performance of the circuit section 30 caused by the temperature increase can be reduced without forming a vent or adding a cooling fan, i.e., without loss of design of the housing 32.

Further, as shown in FIG. 3, according to the present embodiment, the first direction and the second direction are almost perpendicular to each other, and the opening width W1 of the housing 32 in the second direction decreases with an increase in the distance from the base 22 in the first direction. Thus, when the circuit section 30 is implemented away from the base 22, the distance between the circuit section 30 and the housing 32 is small compared to when the circuit section 30 is implemented in contact with the base 22. In other words, layers of air between the housing 32 and each of the circuit section 30 and a region of the board 24 where the circuit section 30 is implemented becomes thin. Therefore, as indicated by a solid arrow in FIG. 3, heat generated in the circuit section 30 and the heat radiated from the sun and transferred from the roof 11 through the base 22 are likely to be dissipated to the housing 32. Even when a temperature of the housing 32 increases accordingly, the housing 32 can be cooled by airflow generated when the vehicle is moving. For these reasons, the degradation in performance of the circuit section 30 caused by the temperature increase can be reduced effectively compared to when the housing 32 has a uniform opening width W1.

In particular, according to the present embodiment, not only the opening width W1 in the second direction but also an area of an opening surface of the housing 32 perpendicular to the first direction decreases with an increase in the distance from the base 22 in the first direction. The opening surface area of a portion where the circuit section 30 is located is smaller than the opening surface area of a portion which is located closer to the base 22 than the circuit section 30 in the first direction. Thus, in a plane perpendicular to not only the second direction but also the first direction, both heat from the circuit section 30 and heat from the board 24 on which the circuit section 30 is implemented are likely to be dissipated to the housing 32. Therefore, the degradation in performance of the circuit section 30 caused by the temperature increase can be reduced more effectively.

Further, according to the present embodiment, the circuit section 30 includes the power amplifier which generates the most heat in the wireless communication circuit. However, as described above, the circuit section 30 is located away from the base 22 in the first direction and located close to the housing 32 in the second direction. Therefore, although the power amplifier is included, the degradation in the performance of the circuit section 30 can be reduced.

In the structure where the board 24 is stood on the base 22, and the circuit section 30 is implemented on the board 24 at a position away from the base 22 in the first direction, the relationship between the first direction and the second direction is not limited to the above relationship in which they are almost perpendicular to each other. What is needed is that the first direction and the second direction are different from each other. For example, the first surface 22a of the base 22 can form an angle of 60° with the surface of the board 24 where the antenna element section 26 is formed.

Second Embodiment

Descriptions of the same structures of the present embodiment as those of the antenna device 20 of the above-described embodiment are omitted.

Figure 4:
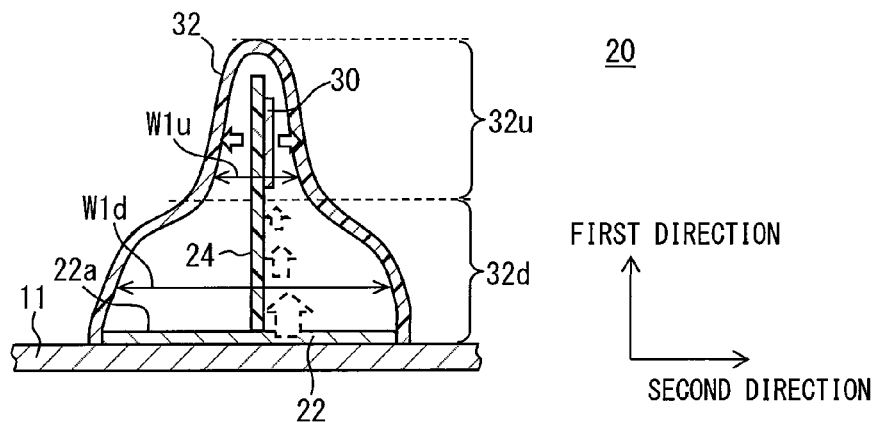
FIG. 4 is a diagram illustrating a cross-sectional view of a simplified structure of a vehicle-mounted antenna device according to a second embodiment and corresponds to FIG. 3.

As exemplified in FIG. 4, according to the present embodiment, the first direction and the second direction are almost perpendicular to each other. The housing 32 has a lower part 32d and an upper part 32u. The lower part 32d extends from an end of the housing 32 on the base 22 side to a predetermined height in the first direction. The upper part 32u is located further away from the base 22 than the lower part 32d. The opening width W1 is set so that a minimum value of an opening width W1d of the lower part 32d in the second direction can be greater than a maximum value of an opening width W1u of the upper part 32u in the second direction. That is, the opening width W1 is smaller in the upper part 32u than in the lower part 32d. The circuit section 30 is located in the upper part 32u. The other aspects are the same as those of the first embodiment.

As shown in FIG. 4, the opening width W1d decreases with an increase in the distance from the base 22 in the first direction and is a minimum at a top end of the lower part 32d. On the other hand, the opening width W1u decreases with an increase in the distance from the base 22 in the first direction and is a maximum at a bottom end of the upper part 32u. The area of the opening surface of the housing 32 perpendicular to the first direction decreases with an increase in the distance from the base 22 in the first direction. Thus, the opening surface area of the lower part 32d is a minimum at the top end, and the opening surface area of the upper part 32u is a maximum at the bottom end.

When the circuit section 30 is placed in the upper part 32u as described above, a distance between the circuit section 30 and the housing 32 is small compared to when the circuit section 30 is placed in the lower part 32d. In other words, layers of air between the housing 32 and each of the circuit section 30 and a region of the board 24 where the circuit section 30 is implemented become thin. Therefore, as indicated by a solid arrow in FIG. 4, heat generated in the circuit section 30 and the heat radiated from the sun and transferred from the roof 11 through the base 22 are likely to be dissipated to the housing 32. Even when a temperature of the housing 32 increases accordingly, the housing 32 can be cooled by airflow generated when the vehicle is moving. For these reasons, the degradation in performance of the circuit section 30 caused by the temperature increase can be reduced more effectively.

Since effects other than those described above are the same as those of the first embodiment, their descriptions are omitted.

In an example shown in FIG. 4, the opening widths W1d and W1u decrease with an increase in the distance from the base 22, the opening width W1d is a minimum at the top end of the lower part 32d, and the opening width W1u is a maximum at the bottom end of the upper part 32u. However, the structure of the housing 32 is not limited to the example. What is needed is that the minimum value of the opening width W1d is greater than the maximum value of the opening width W1u. For example, at least one of the lower part 32d and the upper part 32u can have a uniform opening width over a predetermined length in the first direction. For example, each of the opening width W1d of the lower part 32d and the opening width W1u of the upper part 32u can be uniform over their entire lengths in the first direction so that the housing 32 can be convex in cross section.

Third Embodiment

Descriptions of the same structures of the present embodiment as those of the antenna device 20 of the above-described embodiment are omitted.

Figure 5:
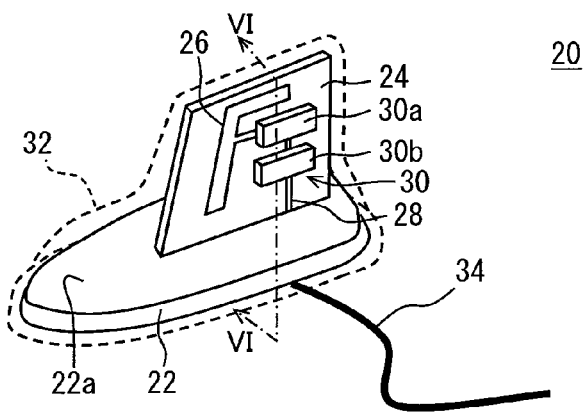
FIG. 5 is a diagram illustrating a perspective view of a simplified structure of a vehicle-mounted antenna device according to a third embodiment and corresponds to FIG. 2.
Figure 6:
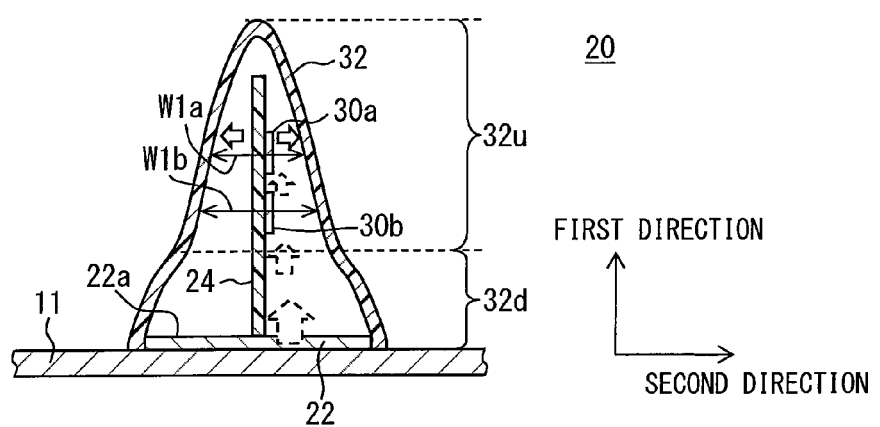
FIG. 6 is a diagram illustrating a cross-sectional view taken along the line VI-VI in FIG. 5 and corresponds to FIG. 3.

As exemplified in FIGS. 5 and 6, according to the present embodiment, the circuit section 30 includes two components 30a and 30b which are independent of each other. When operating, the first component 30a generates more heat than the second component 30b. They are implemented on the board 24 so that the first component 30a can be located further away from the base 22 than the second component 30b in the first direction. In an example shown in FIGS. 5 and 6, the first component 30a has a RF circuit including a power amplifier, and the second component 30b has a baseband circuit.

In such an approach, as indicated by a broken arrow in FIG. 6, heat radiated from the sun and transferred through the base 22 from the roof 11 to the first component 30a can be made smaller than heat radiated from the sun and transferred to the second component 30b. Thus, an increase in temperature of the first component 30a, which generates more heat, can be reduced. Therefore, the degradation in the performance of the circuit section 30, in particular, the first component 30a caused by the temperature increase can be reduced without loss of design of the housing 32.

Further, in the present embodiment, like in the first embodiment, the first direction and the second direction are almost perpendicular to each other, and the opening width W1 of the housing 32 in the second direction decreases with an increase in the distance from the base 22 in the first direction. Accordingly, an opening width W1a at the first component 30a is smaller than an opening width W1b at the second component 30b. In other words, the first component 30a is located closer to the housing 32 than the second component 30b. Therefore, as indicated by a solid arrow in FIG. 6, heat generated in the first component 30a and the heat radiated from the sun and transferred from the roof 11 through the base 22 are likely to be dissipated to the housing 32. Even when a temperature of the housing 32 increases accordingly, the housing 32 can be cooled by airflow generated when the vehicle is moving. For these reasons, the degradation in the performance of the first component 30a, which generates more heat, can be reduced more effectively.

Further, like in the first embodiment, not only the opening width W1 of the housing 32 in the second direction but also the area of the opening surface of the housing 32 perpendicular to the first direction decreases with an increase in the distance from the base 22 in the first direction. Accordingly, the opening surface area of a portion where the first component 30a is located is smaller than the opening surface area of a portion where the second component 30b is located. Therefore, the degradation in the performance of the first component 30a caused by the temperature increase can be reduced more effectively.

Further, like in the second embodiment, the housing 32 includes the lower part 32d and the upper part 32u in the first direction. Further, the minimum value of the opening width W1d of the lower part 32d in the second direction is greater than the maximum value of the opening width W1$u$ of the upper part 32$u$ in the second direction. The first component 30$a$ is placed in the upper part 32$u$.

When the first component 30$a$, which generates more heat, is placed in the upper part 32$u$ as described above, a distance between the first component 30$a$ and the housing 32 is small compared to when the first component 30$a$ is placed in the lower part 32$d$. Thus, the heat generated in the first component 30$a$ and the heat radiated from the sun and transferred from the roof 11 through the base 22 are likely to be dissipated to the housing 32. Therefore, the degradation in the performance of the first component 30$a$ caused by the temperature increase can be reduced more effectively. It is noted that in the present embodiment, the second component 30$b$ is also placed in the upper part 32$u$.

The number of components included in the circuit section 30 is not limited to two, and can be three or more. When it is three or more, and a first component 30$a$ generates more heat than a second component 30$b$ when operating, what is needed is that they are implemented on the board 24 so that the first component 30$a$ can be located further away from the base 22 than the second component 30$b$.

Fourth Embodiment

Descriptions of the same structures of the present embodiment as those of the antenna device 20 of the above-described embodiment are omitted.

Figure 7:
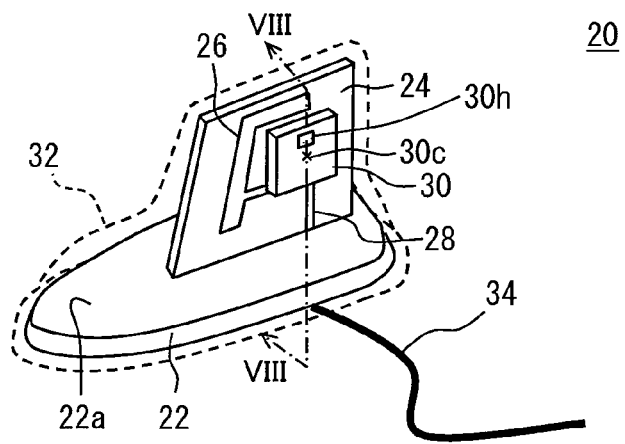
FIG. 7 is a diagram illustrating a perspective view of a simplified structure of a vehicle-mounted antenna device according to a fourth embodiment and corresponds to FIG. 2.
Figure 8:
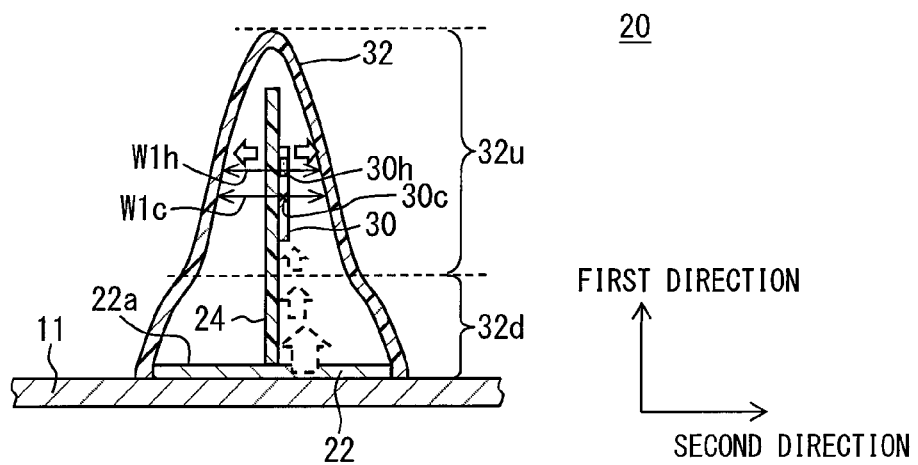
FIG. 8 is a diagram illustrating a cross-sectional view taken along the line VIII-VIII in FIG. 7 and corresponds to FIG. 3.

As exemplified in FIGS. 7 and 8, according to the present embodiment, the circuit section 30 is implemented on the board 24 in such an arrangement that a portion 30$h$ (hereinafter referred to as the high-temperature portion 30$h$) having a peak of a temperature distribution produced by heat generated when operating can be located further away from the base 22 than a center portion 30$c$ of the circuit section 30 in the first direction. The arrangement can be translated into a direction. The temperature distribution is a temperature distribution of the board 24 in a plane along the surface of the circuit section 30 where the antenna element section 26 is formed. The center portion 30$c$ is a center of the circuit section 30 in the plane.

In such an approach, as indicated by a broken arrow in FIG. 6, heat radiated from the sun and transferred through the base 22 from the roof 11 to the high-temperature portion 30$h$ of the circuit section 30 can be reduced compared to, for example, when the high-temperature portion 30$h$ is located closer to the base 22 than the center portion 30$c$. Thus, an increase in temperature of the high-temperature portion 30$h$ can be reduced. Therefore, the degradation in the performance of the circuit section 30, in particular, the high-temperature portion 30$h$ caused by the temperature increase can be reduced without loss of design of the housing 32.

Further, in the present embodiment, like in the first embodiment, the first direction and the second direction are almost perpendicular to each other, and the opening width W1 of the housing 32 in the second direction decreases with an increase in the distance from the base 22 in the first direction. Accordingly, an opening width W1$f$ at the high-temperature portion 30$h$ is smaller than an opening width W1$c$ at the center portion 30$c$. In other words, the high-temperature portion 30$h$ is located closer to the housing 32 than the center portion 30$c$. Therefore, as indicated by a solid arrow in FIG. 6, the heat of the high-temperature portion 30$h$ and the heat radiated from the sun and transferred from the roof 11 through the base 22 are likely to be dissipated to the housing 32. Even when a temperature of the housing 32 increases accordingly, the housing 32 can be cooled by airflow generated when the vehicle is moving. For these reasons, the degradation in the performance of the circuit section 30, in particular, the high-temperature portion 30$h$ can be reduced more effectively.

Further, like in the first embodiment, not only the opening width W1 of the housing 32 in the second direction but also the area of the opening surface of the housing 32 perpendicular to the first direction decreases with an increase in the distance from the base 22 in the first direction. Accordingly, the opening surface area of a portion where the high-temperature portion 30$h$ is located is smaller than the opening surface area of a portion where the center portion 30$c$ is located. Therefore, the degradation in the performance of the high-temperature portion 30$h$ caused by the temperature increase can be reduced more effectively.

Further, like in the second embodiment, the housing 32 includes the lower part 32$d$ and the upper part 32$u$ in the first direction. Further, the minimum value of the opening width W1$d$ of the lower part 32$d$ in the second direction is greater than the maximum value of the opening width W1$u$ of the upper part 32$u$ in the second direction. The high-temperature portion 30$h$ is placed in the upper part 32$u$.

When the circuit section 30 is implemented on the board 24 so that the high-temperature portion 30$h$ an be placed in the upper part 32$u$ as described above, a distance between the high-temperature portion 30$h$ and the housing 32 is small compared to when the high-temperature portion 30$h$ is placed in the lower part 32$d$. Thus, the heat of the high-temperature portion 30$h$ and the heat radiated from the sun and transferred from the roof 11 through the base 22 are likely to be dissipated to the housing 32. Therefore, the degradation in the performance of the high-temperature portion 30$h$ caused by the temperature increase can be reduced more effectively. It is noted that in the present embodiment, the whole of the circuit section 30 is placed in the upper part 32$u$.

Modifications

While the present disclosure has been described with reference to the embodiments, it is to be understood that the disclosure is not limited to the embodiments. The present disclosure is intended to cover various modifications and equivalent arrangements inside the spirit and scope of the present disclosure.

In the embodiments, the circuit section 30 is implemented on one side of the board 24. Alternatively, the circuit section 30 can be implemented on both sides of the board 24.

In the embodiments, the antenna element section 26 has an antenna element designed for vehicle-to-vehicle communication which uses radio waves of a frequency of 5.9 GHz band. However, the frequency of radio waves used by the antenna element section 26 and the use of the antenna element section 26 are not limited to the embodiments.

What is claimed is:
1. A vehicle-mounted antenna device comprising:
a base mountable on a roof of a vehicle;
a board having an antenna element section and stood on a surface of the base;
a circuit section serving as at least part of a wireless communication circuit electrically connected to the antenna element section, and
a housing made of a resin material and forming a projection of an outer shape of the vehicle, wherein
the board is stood on the surface of the base in such a manner that a first direction perpendicular to the sur- face of the base is different from a second direction equal to a thickness direction of the board, the board and the circuit section are located in a space formed by the base and the housing, and the circuit section is mounted on the board at a position away from the base in the first direction.

2. The vehicle-mounted antenna device according to claim 1, wherein the first direction and the second direction are perpendicular to each other, and an opening width of the housing in the second direction decreases with an increase in distance from the base in the first direction.

3. The vehicle-mounted antenna device according to claim 2, wherein an area of an opening surface of the housing perpendicular to the first direction decreases with the increase in distance from the base in the first direction.

4. The vehicle-mounted antenna device according to claim 1, wherein the first direction and the second direction are perpendicular to each other, the housing has a lower part and an upper part, the lower part extends from an end of the housing on the base side to a predetermined height in the first direction, the upper part is located further away from the base than the lower part, a minimum value of an opening width of the lower part in the second direction is greater than a maximum value of an opening width of the upper part in the second direction, and the circuit section is located in the upper part.

5. The vehicle-mounted antenna device according to claim 1, wherein the circuit section includes a plurality of components including a first component and a second component, the first component generates more heat than the second component when operating, and the first component and the second component are mounted on the board in such a manner that the first component is located further away from the base than the second component.

6. The vehicle-mounted antenna device according to claim 1, wherein the circuit section is mounted on the board in such an arrangement that a portion having a peak of a temperature distribution produced by heat generated when operating is located further away from the base than a center portion of the circuit section in the first direction.

7. The vehicle-mounted antenna device according to claim 1, wherein the circuit section has a power amplifier configured to amplify a transmitting signal.

8. The vehicle-mounted antenna device according to claim 1, wherein the circuit section is mounted on a surface of the board, which is perpendicular to the second direction.

9. The vehicle-mounted antenna device according to claim 1, wherein the circuit section has a height, which is along the first direction, a thickness, which is along the second direction, and a width, which is perpendicular to both the first direction and the second direction, and the thickness is less than the height and the width.

10. The vehicle-mounted antenna device according to claim 1, wherein the first direction and the second direction are perpendicular to each other.

11. The vehicle-mounted antenna device according to claim 1, wherein the circuit section is in a rectangular shape, the circuit section has one end and an other end in the second direction, and the other end is farther than the one end from the board.

12. The vehicle-mounted antenna device according to claim 1, wherein the board is in a flat plate shape, and the base is in a flat plate shape.

13. The vehicle-mounted antenna device according to claim 1, wherein the circuit section includes at least one of an amplifier for amplifying a signal, a switch for switching a power line, a transmitting-side bandpass filter, a receiving-side bandpass filter, a radio frequency transceiver circuit, and a baseband circuit.

14. The vehicle-mounted antenna device according to claim 1, wherein the circuit section is at least one of:

a semiconductor chip, in which a circuit is integrated; and a mold package, in which a wireless communication circuit is integrally sealed with resin.

15. The vehicle-mounted antenna device according to claim 1, wherein the board is stood on the surface of the base such that:

the board is not stacked on the surface of the base; and the thickness direction of the board is not equal to a thickness direction of the base.

16. The vehicle-mounted antenna device according to claim 1, wherein the antenna element section and the circuit section are both disposed on the board.

* * * * *